United States Patent [19]

Kosonocky et al.

[11] 4,040,076

[45] Aug. 2, 1977

[54] CHARGE TRANSFER SKIMMING AND RESET CIRCUIT

[75] Inventors: Walter Frank Kosonocky, Skillman; Elliott Samuel Kohn, East Windsor, both of N.J.

[73] Assignee: RCA Corporation, New York, N.Y.

[21] Appl. No.: 709,410

[22] Filed: July 28, 1976

[51] Int. Cl.² .................. H01L 29/78; H01L 27/14; H01L 31/00; H01J 39/12
[52] U.S. Cl. ........................ 357/24; 357/15; 357/30; 250/211 J; 250/338; 307/221 D
[58] Field of Search ............ 357/24, 30, 15; 250/211 J, 338; 307/221 D, 221 C, 311

[56] References Cited

U.S. PATENT DOCUMENTS

| 3,845,295 | 10/1974 | Williams et al. | 357/24 |
|---|---|---|---|
| 3,866,067 | 2/1975 | Amelio | 357/24 |
| 3,902,066 | 8/1975 | Roosild et al. | 357/24 |

OTHER PUBLICATIONS

Kohn "A Charge-Coupled Infrared Imaging Array with Schottky Barrier Detectors", IEEE J. Solid-State Circuits, vol. SC-11, (Feb. 1976), pp. 139-146.

*Primary Examiner*—William D. Larkins
*Assistant Examiner*—Gene M. Munson
*Attorney, Agent, or Firm*—H. Christoffersen; Samuel Cohen

[57] ABSTRACT

The portion which exceeds a given level, of a charge signal present at a radiation sensor, is passed to a storage site via the conduction path beneath a gate electrode. The remainder of the charge signal is removed to a drain through the same conduction path, the radiation sensor being reset to a reference level in the process. The use of a common conduction path for setting both the charge signal "skimming" level and the reset level, improves the uniformity of the skimming process from one sensor to another.

6 Claims, 3 Drawing Figures

CHARGE TRANSFER SKIMMING AND RESET CIRCUIT

The invention described herein was made in the course of a contract with the Department of the Air Force.

The present invention relates to charge transfer circuits and particularly to those employed for "skimming" a charge signal.

U.S. Pat. No. 3,845,295 to W. F. Kosonocky (one of the present inventors) and B. F. Williams for "Charge Coupled Radiation Sensing Circuit with Charge Skim-Off And Reset" issued Oct. 29, 1974, describes a charge skimming circuit and discusses also where such circuits are useful. In the patented circuit, a photodiode or other radiation sensor accumulates charge when a radiation image is projected thereon. After a suitable integration time, that portion of the charge which is greater than a given level is passed through the conduction path of one field effect transistor (FET) to a stage of a CCD register. Then, the remainder of the charge signal is passed through the conduction path of a second FET transistor to a drain, resetting the radiation sensor in the process. If, as is often the case, the threshold voltage of the FET's varies from one location to another, there will be non-uniformities introduced into the skimming process. For example, if the threshold voltage for the various reset transistors is not the same, the radiation sensors in the array will not be reset to the same reference voltage level. Similarly, if the transistors employed to skim the charge signals do not have the same threshold voltage, the point at which the skimming starts will not be the same from one radiation sensor to another. Also, if the threshold level of a reset transistor for a location differs from that of the skimming transistor of that location, the difference between threshold levels will be introduced into the skimmed signal as a charge increment (or as a charge deficit). In all of these cases, the differences in skimming and reset levels are manifested as fixed pattern noise in the reproduced image.

The present invention relates to a circuit of the same general type as discussed in the above-identified patent, but in which non-uniformities due to different threshold voltages are essentially eliminated. In the drawing.

Figure 1:
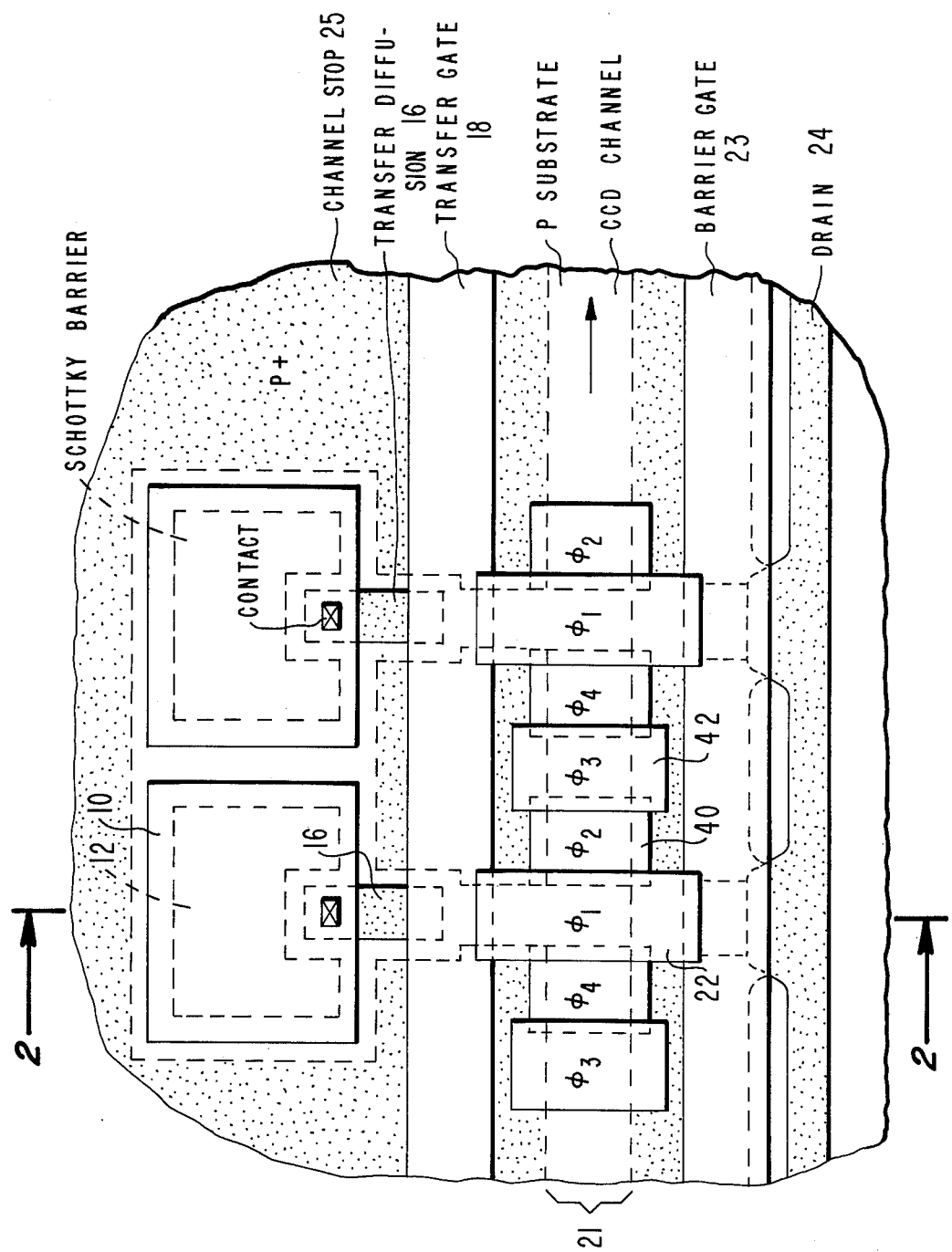
FIG. 1 is a plan view of a portion of an infrared imager embodying the invention.
Figure 2:
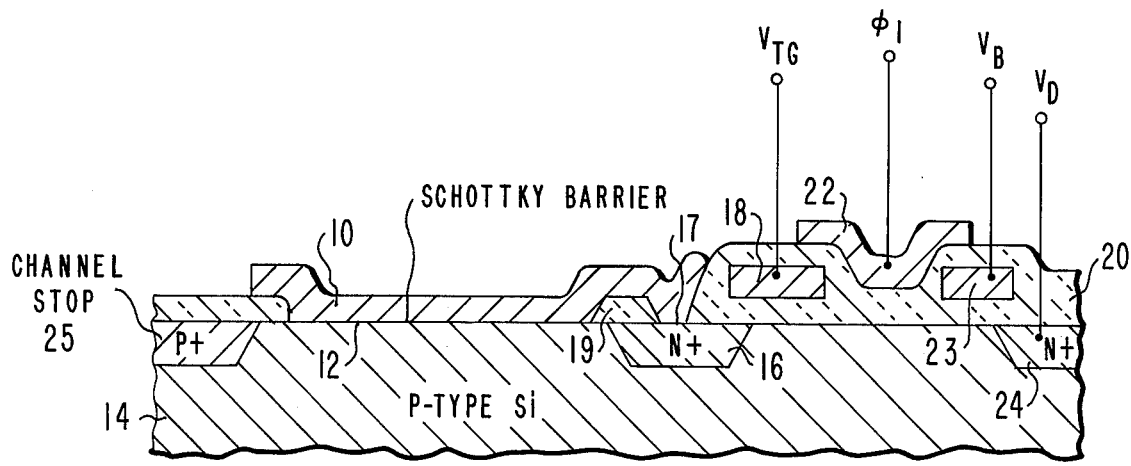
FIG. 2 is a section taken along line 2—2 of FIG. 1.

The imager illustrated in FIGS. 1 and 2 is of the Schottky barrier type and is especially suitable for the detection of infra-red radiation. Each location can be considered to include a Schottky barrier device and a stage of the CCD register. The former includes a metal electrode 10 such as one formed of aluminum. At the interface 12 of the metal electrode and the semiconductor substrate 14 there is a Schottky barrier formed of a material such as platinum silicide, palladium silicide or the like. The substrate 14 may be a P type silicon substrate.

The remainder of the structure at each location includes an N type diffusion 16 which serves as a means for transferring the charge accumulated at the Schottky barrier device to the remainder of the structure. This diffusion is in ohmic contact with the aluminum at 17 and is overlapped at one edge by a transfer gate electrode 18. Region 19 is an insulating layer formed of silicon dioxide. Electrodes 18, 22 and 23 may be formed of polysilicon or a metal and are insulated from the substrate by insulating layer 20 which may be formed of silicon dioxide. The transfer gate electrode 18 couples the various Schottky barriers to a charge-coupled device (CCD) output register 21. One of the electrodes 22 of the register is illustrated in the cross-section view. The following electrode 23 is a barrier gate electrode and its purpose is to control the flow of background charge to drain diffusion 24. The latter is formed of N type material. Channel stops 25, comprising regions of the substrate of the same conductivity type as the substrate but of higher impurity concentration than the substrate, serve to confine the flow of charge to desired paths.

Figure 3:
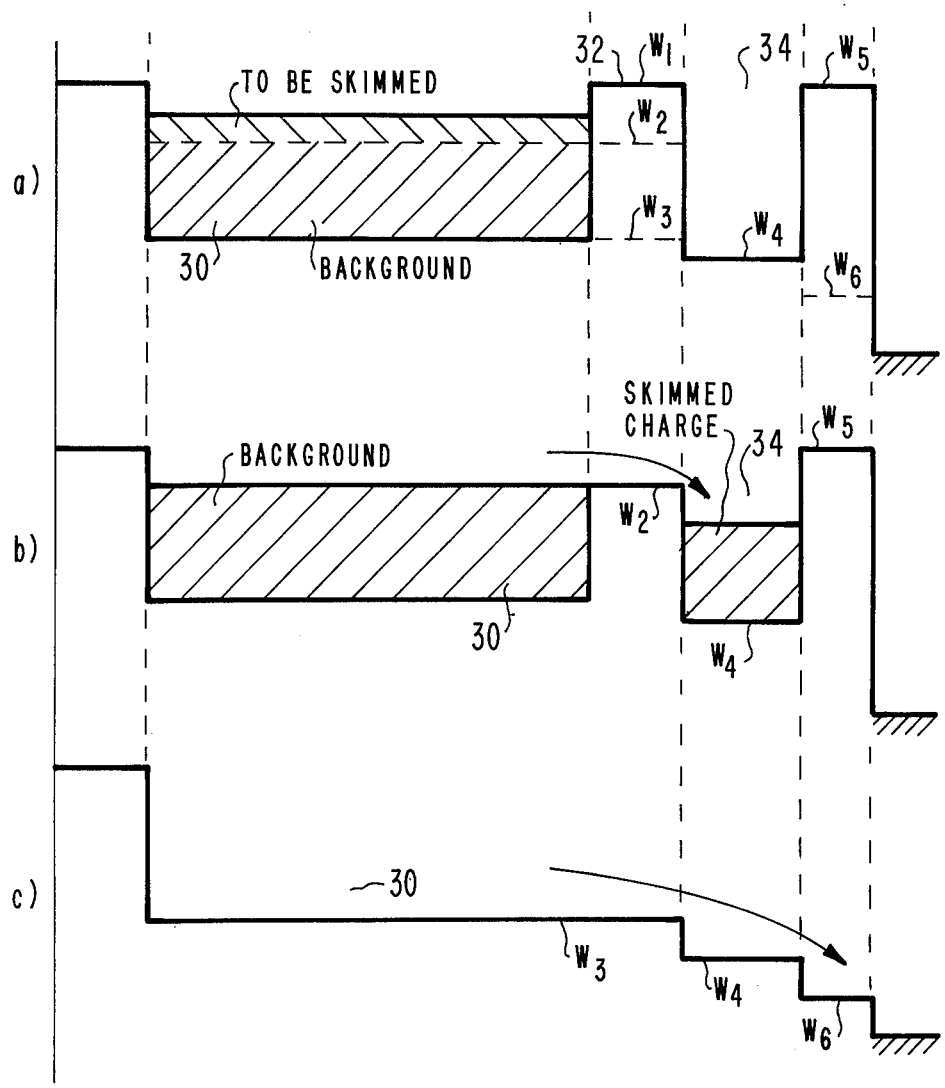
FIG. 3 is a drawing of surface potential profiles to help explain the operation of the imager of FIGS. 1 and 2.

The operation of the array is illustrated in FIG. 3. During an integration time, the radiation reaching the Schottky barrier excites carriers in the metal or silicide. Those of the excited carriers with sufficient momentum in the direction of the Schottky barrier can cross the barrier and become majority carriers in the silicon substrate (holes in the example illustrated), thus discharging the detector. There remains in the metal or silicide free electrons corresponding to the holes which have passed into the substrate, and these free electrons are the charge signals which later may be read out via the transfer diffusion 16 which is in ohmic contact with the metal electrode 10.

FIG. 3 illustrates at a the situation at the end of the integration time. A relatively large amount of radiation-induced charge signal (electrons) is present in the Schottky barrier detector 12. The transfer gate electrode 18 is at a substantially less positive potential than the electrode 10 and there is therefore a barrier 32 beneath this gate electrode. The surface potential of this barrier is denoted as $W_1$. Transfer electrode 22 is maintained at a sufficiently positive potential to create a relatively deep potential well 34 beneath electrode 22. Note that the surface potential $W_4$ is lower than the surface potential $W_0$ beneath electrode 10. The voltage $V_B$ applied to the barrier gate electrode 23 can be the same as that applied to transfer gate electrode 18 so that $W_5$ can be equal to $W_1$.

Upon the completion of the integration time, the charge signal 30 is skimmed in the manner illustrated at b in FIG. 3. The potential $V_{TG}$ applied to the transfer gate 18 is made somewhat more positive to drop the height of barrier 32 from $W_1$ to $W_2$. A portion of the charge signal 30 (electrons) now passes from the Schottky barrier detector at 12 through the metal 10 and transfer diffusion 16, over the barrier of height $W_2$ and flows into the well 34, as shown.

The next stop in the process is not illustrated. It comprises making the potentials $\phi_2$ and $\phi_3$ applied to the phase 2 and phase 3 electrodes such as 40 and 42 more positive while $V_{TG}$ is set at a level such that the barrier $W_1$ is present beneath gate electrode 18. Electrode 40 is made sufficiently positive to produce a deep well beneath electrode 40, say as deep or almost as deep as 34, and the well beneath electrode 42 is made deeper still. At the same time, the potential $\phi_1$ can be made less positive such that the charge stored in the potential wells beneath the $\phi_1$ electrodes pass to beneath the $\phi_3$ electrodes. Thereafter, the potential $\phi_2$ is decreased to create potential barriers between the potential wells beneath the $\phi_3$ electrodes and the potential wells beneath the $\phi_1$ electrodes, and the voltage $\phi_1$ is returned to its original value such that the surface potential beneath the $\phi_1$ electrodes is $W_4$. The barrier $W_1$ isolates the CCD 21 from the Schottky detectors during the shifting process just described.

Summarizing what has occured up to this point, each charge signal has been skimmed. The skimmed portion of the charge signal initially was transferred from the Schottky barrier detectors to beneath the corresponding $\phi_1$ electrodes of the CCD register 21. Then these charge signals were shifted from beneath the $\phi_1$ electrodes to beneath the $\phi_3$ electrodes for temporary storage there.

Next, the voltage $V_{TG}$ applied to the transfer gate 18 is made more positive to lower the surface potential beneath electrodes 18 to $W_3$. $W_3$ establishes the surface potential $W_0$ (FIG. 3 at $a$), that is, $W_3$ is the level to which the Schottky barrier will be reset. At the same time, the voltage $V_B$ applied to the barrier gate electrode is made sufficiently positive to make the surface potential $W_6$ beneath electrode 23 lower than the surface potential $W_4$. The background charge remaining in the Schottky barrier detector at 12 now flows to the drain diffusion 24, as indicated at c in FIG. 3.

After the background charge has been removed in the manner just discussed, $V_{TG}$ is made less positive to again create the barrier of height $w_1$ beneath transfer gate 18. Then, the charge signals stored beneath the $\phi_3$ electrodes of the CCD register are clocked out of the system by suitable adjustment of the four-phase voltages $\phi_1$-$\phi_4$, in conventional fashion. The signals thereby read out serially from the CCD register 21 are video signals which may be displayed on the screen of a kinescope or processed in other ways.

The significant improvement of the present invention is that the effect of different threshold voltages of different gate electrodes is eliminated. The skimming level is set by transfer gate electrode 18. The reset level is also set by the same transfer gate electrode 18. There is an MOS (metal-oxide-semiconductor) threshold, call it $V_{TH}$, associated with gate 18 and it is true that it is difficult to predict what it may be. It is difficult to predict in the sense that its value is a function of process variables such as insulation thickness, as an example, and other parameters which cannot easily be controlled. However, since a common gate electrode is employed, the effect of such differences in the threshold voltage cancels. In other words, if $V_{TG1}$ is the skimming voltage level producing the surface potential $W_2$, that surface potential is proportional to $V_{TG1}$-$V_{TH}$. Similarly, if $V_{TG2}$ is the reset voltage level producing the reset surface potential $W_3=W_0$, the latter is proportional to $V_{TG2}$-$V_{TH}$. Therefore, the difference between surface potentials $W_3$ and $W_2$ is equal to ($V_{TG2}$-$V_{TG1}$) and is independent of the threshold voltage of the gate electrode 18. This holds at each storage location.

While the invention has been illustrated in terms of an array employing a P type substrate, it is of course to be understood that an N type substrate (P channel) could be used instead with suitable modification of operating voltages. It is also to be understood that while the output register is shown as a surface channel CCD, a buried channel CCD could be used instead. Further, the invention is not limited to the use of a CCD output register. A second alternative would be a charge transfer output register of the bucket brigade type. It is also to be understood that while for purposes of illustration Schottky barriers are shown as the radiation sensors, other forms of such sensors may be employed instead. As examples, photodiodes may be used, and depending upon the frequency spectrum of interest, other sensors which are especially sensitive to these particular wavelengths may be used.

A preferred construction method for the Schottky barrier devices illustrated is as follows. After the channel-stop and source-drain diffusions are made in the wafer, insulation (SiO$_2$), whose thickness is of the order of 1,000 to 2,000A, is grown. The polysilicon gates (if such are used) are deposited, defined, and oxidized. Contact holes are made wherever they are needed for interconnection as well as where the Schottky-barrier detectors are to be. A metal such as palladium or platinum which reacts with silicon to form a silicide is deposited and reacted with the silicon in the contact holes, by heating to about 450° C for 10 to 20 minutes or so. The unreacted metal (which is mostly on the oxide) is then removed chemically. The actual Schottky-barrier is at the interface between the silicide and the silicon. Metals which do not react with silicon can be used instead of palladium or platinum, but they are not removed during the manufacturing process.

In the mode of operation discussed herein in which the skimmed charge temporarily is stored within the CCD register while the background charged is "dumped", the output register should include a sufficient number of elements per stage to permit such temporary storage. A four-phase register such as the one illustrated is suitable. Alternatively, the register may be a five or higher phase operated register.

While FIG. 3 illustrates only a part of one row of sensors, it is to be appreciated that the invention is applicable to larger arrays. Each row of such a larger array includes a row of Schottky barrier devices such as 10, 12, a CCD register such as 21 and a drain such as 24. The output register of the system, in this example, is a CCD register (not illustrated) which extends in the column direction. The last stage of each row CCD register is coupled to a different stage of the system output register via a common gate electrode (not illustrated). This gate electrode controls the transfer, in parallel, of the charge signals stored in the row CCD registers (a column of charge signals) to the system output register and the latter may be read out serially.

What is claimed is:

1. In a radiation sensing array including a semiconductor substrate, in combination:
   a radiation sensor responsive to radiation for storing a charge signal;
   a gate electrode insulated from said substrate and located adjacent to said sensor;
   a charge storage location;
   means, including means for applying a voltage at a first level to said gate electrode, for conducting that portion of the charge signal stored in said sensor which exceeds a given level, via a conduction path in the substrate adjacent to said gate electrode, to said charge storage location;
   a drain region; and
   means, including means for applying a voltage at a second level to said gate electrode, for conducting that portion which exceeds a second given level of the remainder of said charge signal stored in said sensor to said drain region via the same conduction path in said substrate through which the portion exceeding said given level of said charge was conducted, and for resetting said radiation sensor to a reference level dependent on said second level in the process.

2. In a radiation sensing array as set forth in claim 1, further including:
a charge coupled device output register, said charge storage location being within said register.

3. In a charge transfer circuit as set forth in claim 2, said charge coupled device output register including at least four electrodes per stage, said means for conducting the remainder of said charge signal to said drain further including means for doing so via a potential well beneath a first of said electrodes, said charge storage location comprising a potential well beneath the third of said electrodes, said portion of said charge signal which exceeds said given level being transmitted thereto via potential wells beneath said first and the second of said electrodes, and further including means for applying a voltage to said second electrode after the transfer of charge to the well beneath said third electrode of a sense to create a potential barrier beneath said second electrode.

4. In a radiation sensing array as set forth in claim 1, said radiation sensor comprising a Schottky barrier device.

5. In a charge skimming circuit which includes a radiation sensor for storing a charge in response to the radiation it receives:
a gate controlled device having a conduction path in a semiconductor substrate and a gate electrode, responsive to a control voltage, insulated from said substrate and located adjacent said sensor;
a charge storage site;
means including said conduction path of said gate controlled semiconductor device for skimming that portion over a given level of the stored charge signal and conveying said skimmed portion via said conduction path to said storage site, said skimmed portion passing under said gate electrode in the process;
a drain; and
means including the conduction path of the same semiconductor device for removing to said drain via the same conduction path, as employed for skimming, the remainder of the charge signal and for setting the radiation sensor to a reference level in the process, said remainder passing under said gate electrode in the process.

6. In a charge skimming circuit as set forth in claim 5, further including:
a charge transfer output register including at least first, second, third and fourth electrodes per stage;
wherein said means for skimming comprises the first, second and third of said electrodes, means for applying potentials to said electrodes for conducting the skimmed charge to said storage site, the latter being adjacent the third of said electrodes, via a conduction path adjacent to the first and second of said electrodes, and means for then changing the potential applied to the second of said electrodes for creating a barrier to the flow of charge from said storage site; and
wherein said means for removing the remainder of said charge signal to said drain comprises the first of said electrodes, said first electrode being located between said semiconductor device and said drain, and means for applying a potential to said first electrode for creating a conduction path between the conduction path of said semiconductor device and said drain.

* * * * *